US008028253B2

(12) United States Patent
Drapeau et al.

(10) Patent No.: US 8,028,253 B2
(45) Date of Patent: Sep. 27, 2011

(54) METHOD AND APPARATUS FOR DETERMINING MASK LAYOUTS FOR A MULTIPLE PATTERNING PROCESS

(75) Inventors: Martin Drapeau, Montreal (CA); Jeffrey P. Mayhew, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 111 days.

(21) Appl. No.: 11/732,268

(22) Filed: Apr. 2, 2007

(65) Prior Publication Data

US 2008/0244504 A1    Oct. 2, 2008

(51) Int. Cl.
  *G06F 17/50* (2006.01)
(52) U.S. Cl. .......................................................... 716/55
(58) Field of Classification Search ................ 716/1–21, 716/50–56
  See application file for complete search history.

(56) References Cited

U.S. PATENT DOCUMENTS

| | | | | |
|---|---|---|---|---|
| 6,553,562 | B2 * | 4/2003 | Capodieci et al. | 716/19 |
| 2004/0023127 | A1 * | 2/2004 | Soper et al. | 430/5 |
| 2004/0068712 | A1 * | 4/2004 | Heng et al. | 716/21 |
| 2007/0248899 | A1 * | 10/2007 | Choi | 430/30 |
| 2008/0148217 | A1 * | 6/2008 | Park | 716/21 |
| 2008/0189672 | A1 * | 8/2008 | Shin et al. | 716/19 |

OTHER PUBLICATIONS

Chen et al., "DFM Challenges for 32nm Node with Double Dipole Lithography and Double Patterning Technology", IEEE International Symposium on Semiconductor Manufacturing, pp. 479-482, Sep. 2006.*
Lim et al., "Positive and Negative Tone Double Patterning Lithography for 50nm Flash Memory", Optical Microlithography XIX/Proceedings of SPIE vol. 6154, Apr. 2, 2006.*
Allgair et al., "Characterization of optical proximity correction features", Proc. SPIE, vol. 4344, pp. 200-207 (2001).*

* cited by examiner

*Primary Examiner* — Vuthe Siek
*Assistant Examiner* — Aric Lin
(74) *Attorney, Agent, or Firm* — Park, Vaughn, Fleming & Dowler LLP

(57) ABSTRACT

One embodiment provides a method for determining mask layouts. During operation, the system can receive a design intent. Next, the system can determine a set of critical edges in the design layout, and select a first edge and a second edge. The system can then determine a first trench and a second trench using the first edge and the second edge, respectively. Note that an edge of the first trench may substantially overlap with the first edge, and an edge of the second trench may substantially overlap with the second edge. Next, the system may assign the first trench and the second trench to the first mask layout and the second mask layout, respectively. The system can then increase the first trench and the second trench, thereby improving pattern fidelity. The resulting mask layouts may be used in a double patterning process.

13 Claims, 5 Drawing Sheets

METHOD AND APPARATUS FOR DETERMINING MASK LAYOUTS FOR A MULTIPLE PATTERNING PROCESS

BACKGROUND

1. Field of the Invention

The present invention relates to integrated circuit design and fabrication. More specifically, the present invention relates to a method and an apparatus to determine mask layouts for a multiple patterning process.

2. Related Art

Dramatic improvements in semiconductor integration densities have largely been achieved through corresponding improvements in semiconductor manufacturing technologies. As semiconductor manufacturing technologies move into the deep sub-micron era, the semiconductor industry is considering a number of new technologies, such as, extreme ultraviolet (EUV) lithography and immersion lithography. Unfortunately, these technologies may not be ready for production in the near future.

Multiple patterning is a promising technology that can increase integration densities using today's process technologies. This technology uses multiple masks to realize features on a wafer. It is desirable to develop systems and techniques that can determine mask layouts for a multiple patterning process.

SUMMARY

One embodiment provides systems and techniques that can determine mask layouts for a multiple patterning process. Specifically, the embodiment can determine mask layouts for a trench split technique.

During operation, the system can receive a design intent. Next, the system can determine a set of critical edges which may need to be printed using different masks. The system can then determine a first trench and a second trench using a first edge and a second edge, respectively. Next, the system can assign the first trench and the second trench to a first mask and a second mask, respectively. The system can then increase the first trench and the second trench. Specifically, the system can keep increasing the trenches as long as they do not violate a design rule. The system can also adjust trench sizes to improve process latitude. One embodiment concurrently adjusts the sizes of the first trench and the second trench.

DETAILED DESCRIPTION

Integrated Circuit (IC) Design Flow

Figure 1:
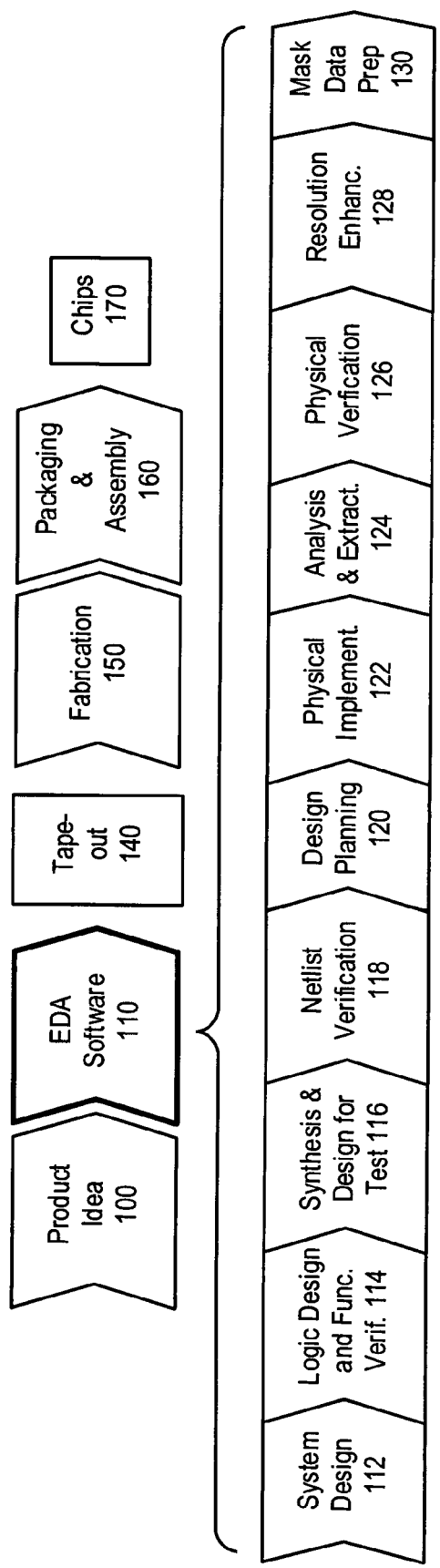
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention.

The process starts with the conception of the product idea (step 100) which is realized using an EDA software design process (step 110). When the design is finalized, it can be taped-out (event 140). After tape out, the fabrication process (step 150) and packaging and assembly processes (step 160) are performed which ultimately result in finished chips (result 170).

The EDA software design process (step 110), in turn, comprises steps 112-130, which are described below. Note that the design flow description is for illustration purposes only. This description is not meant to limit the present invention. For example, an actual integrated circuit design may require the designer to perform the design steps in a different sequence than the sequence described below. The following discussion provides further details of the steps in the design process.

System design (step 112): In this step, the designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, tests can be designed and implemented to check the finished chips. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 120): Here, an overall floorplan for the chip is constructed and analyzed for timing and top-level routing. Exemplary EDA software products from Synopsys, Inc. that can be used at this step include Astro and IC Compiler products.

Physical implementation (step 122): The placement (positioning of circuit elements) and routing (connection of the same) occurs at this step. Exemplary EDA software products from Synopsys, Inc. that can be used at this step include the Astro and IC Compiler products.

Analysis and extraction (step 124): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 126): In this step, the design is checked to ensure correctness for manufacturing, electrical issues, lithographic issues, and circuitry. Exemplary EDA software products from Synopsys, Inc. that can be used at this step include the Hercules product.

Resolution enhancement (step 128): This step involves geometric manipulations of the layout to improve manufacturability of the design. Exemplary EDA software products from Synopsys, Inc. that can be used at this step include Proteus, ProteusAF, and PSMGen products.

Mask data preparation (step 130): This step provides the "tape-out" data for production of masks to produce finished chips. Exemplary EDA software products from Synopsys, Inc. that can be used at this step include the CATS(R) family of products.

Embodiments can be used during one or more of the above-described steps. Specifically, one embodiment can be used during the physical verification step 126 or the resolution enhancement step 128.

Multiple Patterning Process

Figure 2A:
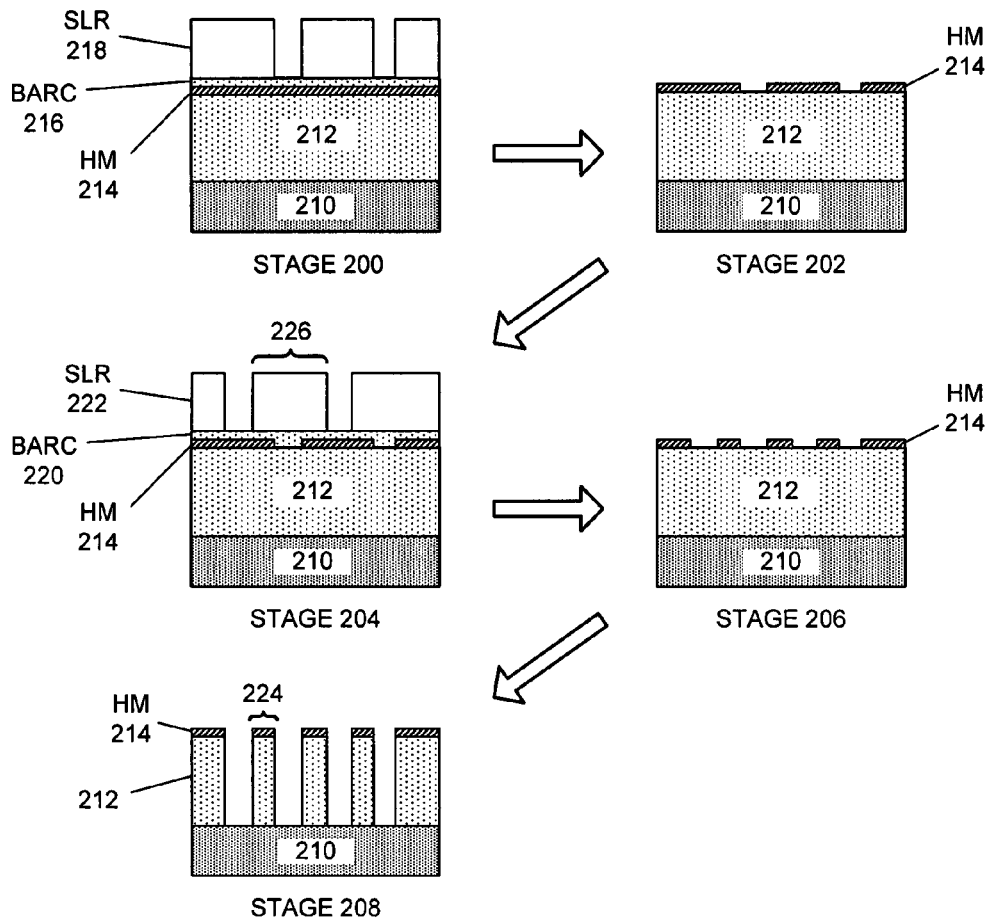
FIG. 2A illustrates how a multiple patterning process can be used to realize features on a wafer in accordance with an embodiment of the present invention.

FIG. 2A illustrates how a multiple patterning process can be used to realize features on a wafer in accordance with an embodiment of the present invention.

Stage 200 illustrates a single layer resist (SLR) 218 on top of a bottom antireflective coating (BARC) 216 which is on top of hard mask (HM) 214. HM 214, in turn, is on top of a polysilicon layer 212, which is on top of wafer 210.

Stage 202 illustrates how the pattern in SLR 218 can be transferred to the HM layer 214 using an etch process. Next, stage 204 illustrates how a second SLR 222 can be placed on top of a second BARC layer 220. Note that the patterns in SLR 218 can be different from the patterns in SLR 222.

Stage 206 illustrates how the pattern in SLR 222 can be transferred to the HM 214. Finally, stage 208 illustrates how the pattern in HM 214 can be transferred to the polysilicon layer 212. Note that HM 214 may be inert to the etch chemistry that is used to etch the polysilicon layer 212.

A multiple patterning process (e.g., a double patterning process) can be used to create feature sizes in a polysilicon layer that are smaller than the minimum feature size that the photolithography process can print on a resist layer. For example, line width 224 in polysilicon layer 212 can be smaller than the minimum line width 226 that can be printed on SLR 222 by the photolithography process. Furthermore, a multiple patterning process (e.g., a double patterning process) can print patterns whose pitch is smaller than the minimum pitch of a single patterning process. The pitch for a line and space pattern is the sum of the line-width and the space-width.

Figure 2B:
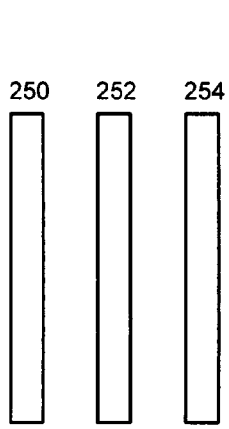
FIG. 2B illustrates a design intent that can be realized using a multiple patterning process in accordance with an embodiment of the present invention.

FIG. 2B illustrates a design intent that can be realized using a multiple patterning process in accordance with an embodiment of the present invention.

The design intent shown in FIG. 2B includes lines 250, 252, and 254. A multiple patterning process can print different regions of line 250 during different process stages.

Figure 2C:
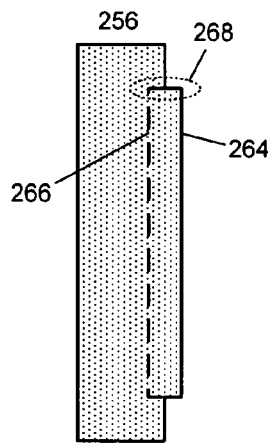
FIG. 2C illustrates a mask pattern that can be used to realize a region of the design intent in accordance with an embodiment of the present invention.

FIG. 2C illustrates a mask pattern that can be used to realize a region of the design intent in accordance with an embodiment of the present invention.

Mask pattern 256 can be used to realize edge 264 of line 250 during a process stage in a multiple patterning process. For example, mask pattern 256 may be used to print the pattern on SLR 218 in stage 200. On the other hand, edge 266 (shown using dotted lines) may be realized during another stage. For example, edge 266 may be printed in stage 204 using a different mask. Further, note that parts of edge 268 may be realized during different process stages.

Figure 2D:
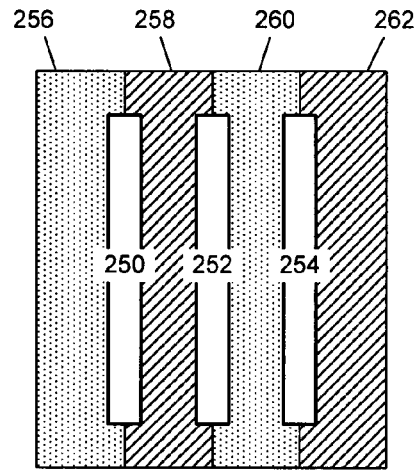
FIG. 2D illustrates how multiple mask layouts can be used to realize a design intent in accordance to an embodiment of the present invention.

FIG. 2D illustrates how multiple mask layouts can be used to realize a design intent in accordance to an embodiment of the present invention.

The design intent shown in FIG. 2B can be realized using mask patterns 256, 258, 260, and 262. Specifically, mask patterns 256 and 258 can be used to realize line 250, mask patterns 258 and 260 can be used to realize line 252, and mask patterns 260 and 262 can be used to realize line 254. Mask patterns 256 and 260 can be part of a first mask layout, whereas mask patterns 258 and 262 can be part of a second mask layout.

Process for Determining Mask Layouts

Figure 3:
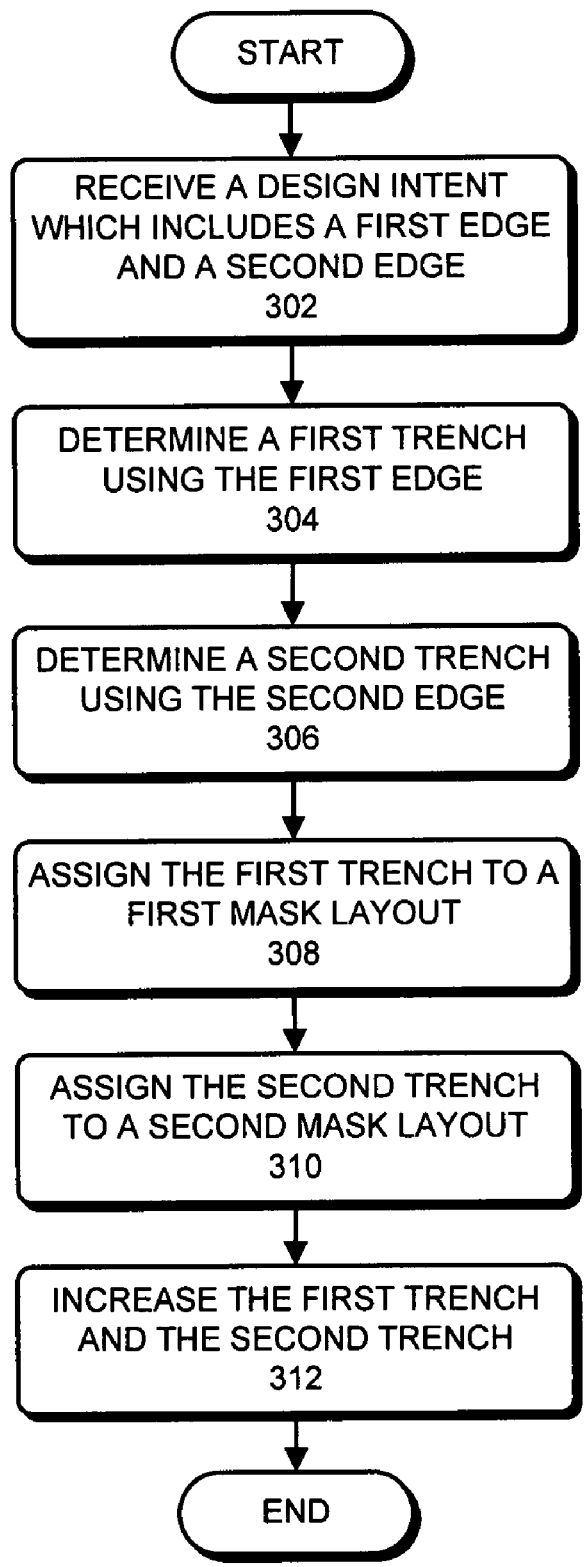
FIG. 3 presents a flowchart that illustrates a process for determining mask layouts for a multiple patterning process in accordance with an embodiment of the present invention.

FIG. 3 presents a flowchart that illustrates a process for determining mask layouts for a multiple patterning process in accordance with an embodiment of the present invention.

In one embodiment, the system determines a first mask layout and a second mask layout that can be used in a double patterning process.

The process usually begins by receiving a design intent which includes a first edge and a second edge (step 302). The design intent can include a first shape and a second shape. The first edge can be associated with the first shape. The second edge can be associated with the second shape.

Figure 4A:
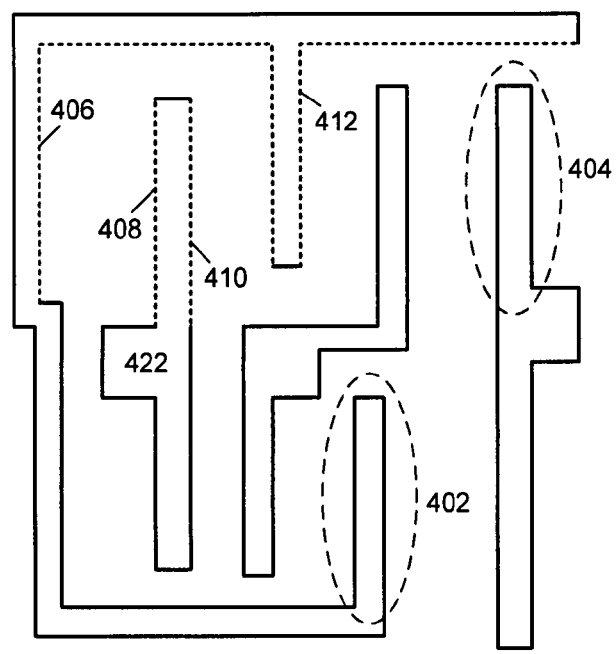
FIG. 4A illustrates a design intent in accordance with an embodiment of the present invention.

FIG. 4A illustrates a design intent in accordance with an embodiment of the present invention.

The design intent shown in FIG. 4A includes a plurality of shapes, such as shapes 402, 404, and 422. The system can then determine a set of critical edges in the design intent. For example, the system can determine critical edges 406, 408, 410, and 412. In one embodiment, the system can determine critical edges by first identifying edges of shapes. From these edges, the system can then remove edges that are part of line ends or corners. The remaining edges can be a set of critical edges. Once the system determines a set of critical edges, the system can then select a first edge and a second edge from the set of critical edges.

Continuing with FIG. 3, the system can determine a first trench using the first edge (step 304). An edge of the first trench may substantially overlap with the first edge.

The system can then determine a second trench using the second edge (step 306). An edge of the second trench may substantially overlap with the second edge.

Figure 4B:
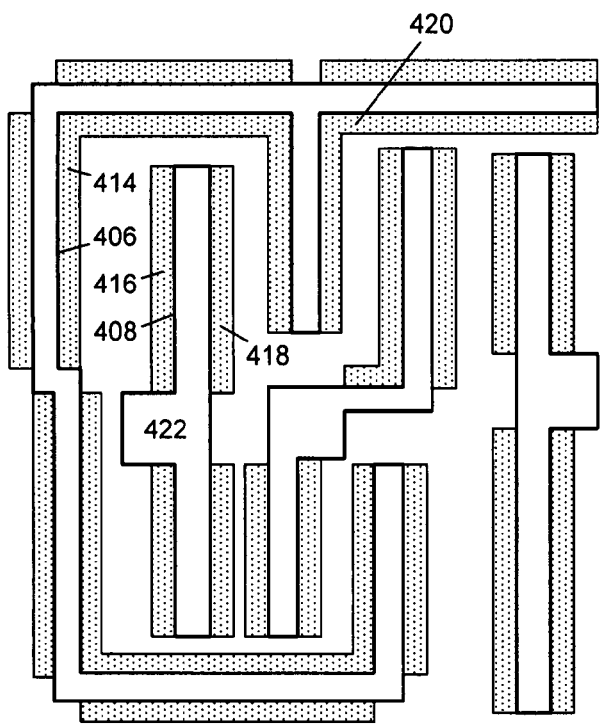
FIG. 4B illustrates how a trench may be determined using an edge in accordance with an embodiment of the present invention.

FIG. 4B illustrates how a trench may be determined using an edge in accordance with an embodiment of the present invention.

The system may determine trench 414 using edge 406. Similarly, the system may determine trenches 416, 418, and 420 using edges 408, 410, and 412, respectively. In one embodiment, the system places a minimum width trench alongside a critical edge. For example, trench 414 may be a minimum width trench that is placed alongside critical edge 406.

When a trench is placed alongside an edge, the trench may substantially cover the shape which includes the edge. For example, trench 416 may substantially cover shape 422. In other words, trench 416 can be the union of the shaded area shown alongside edge 408 and the shape 422. Similarly, trench 418 may substantially cover shape 422.

Continuing with FIG. 3, the system can then assign the first trench to a first mask layout and assign the second trench to a second mask layout (steps 308 and 310).

The system can use a graph to determine how to assign the trenches to the mask layouts. For example, the system can represent trenches using vertices. Further, the system can create an edge between a first vertex and a second vertex if the associated trenches realize two different edges of the same shape. Next, the system can determine a two-coloring for the graph. The trenches that are associated with vertices of a first color can be assigned to the first mask, whereas the trenches that are associated with vertices of a second color can be assigned to the second mask.

Figure 4C:
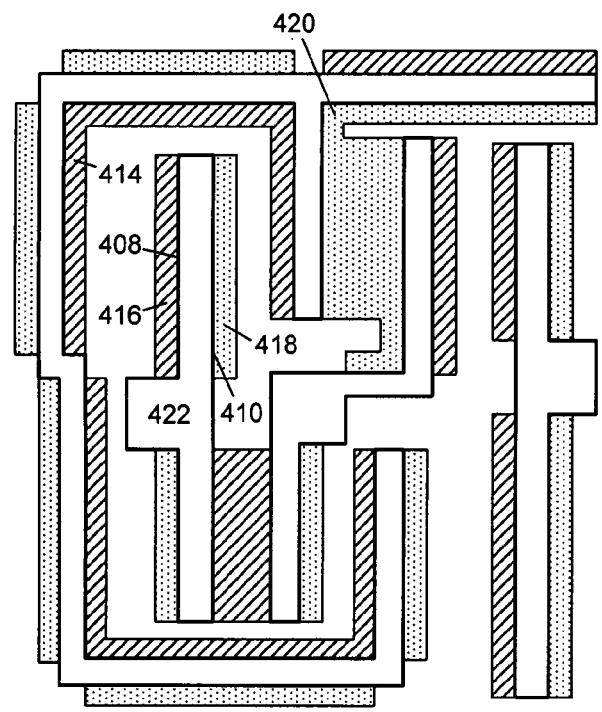
FIG. 4C illustrates how trenches can be assigned to mask layouts in accordance with an embodiment of the present invention.

FIG. 4C illustrates how trenches can be assigned to mask layouts in accordance with an embodiment of the present invention.

The system may represent trenches 414, 416, 418, and 420 using vertices and create edges between them if the associated trenches realize opposing edges of a shape. For example, the system may create an edge between the vertices associated with trenches 416 and 418 because trench 416 realizes edge 410 and trench 418 realizes edge 408. Next, the system may determine a two-coloring for the graph. The system may then use the two-coloring to assign trenches to mask layouts. For example, the system may assign trenches 414 and 416 to a first mask layout (cross hatched trenches) and trenches 418 and 420 to a second mask layout (shaded trenches). For multiple patterning processes that use more than two masks, the system may determine a k-coloring for the graph. Next, the system may use the k-coloring to assign trenches to mask layouts.

Continuing with FIG. 3, the system can then increase the first trench and the second trench (step 312), thereby improving pattern fidelity.

In one embodiment, the system can determine whether the space between a first trench and a second trench violates a design rule. Next, the system can increase the first trench by a first increment in response to determining that the space does not violate the design rule. Note that increasing the first trench by the first increment may decrease the space. The system can then determine whether the decreased space violates a design rule. Next, the system can increase the second trench by a second increment in response to determining that the decreased space does not violate the design rule. The system can perform this process iteratively until the trenches are sufficiently wide or until the space violates a design rule.

Figure 4D:
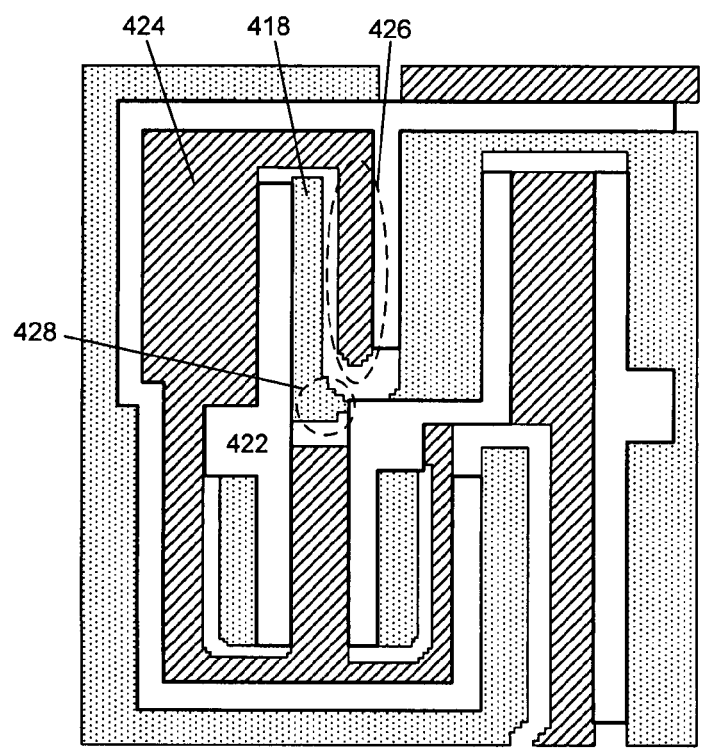
FIG. 4D illustrates how trenches can be increased in accordance with an embodiment of the present invention.

FIG. 4D illustrates how trenches can be increased in accordance with an embodiment of the present invention.

The system may increase trenches 414 and 416 (shown in FIG. 4C) until they touch each other. Next, the system may combine trenches 414 and 416 to obtain trench 424 (shown in FIG. 4D). Note that trench 424 may cover adjacent shapes, such as shape 422.

Trench region 426 is part of trench 424. The system may increase trench 418 until the space between trench 418 and trench region 426 is approximately equal to a desired amount. For example, the system may increase the width of trench 418 and the width of trench region 426 as long as the space between these two trenches does not violate a design rule. Alternatively, the system may stop increasing trench widths if they are adequately large. One embodiment may adjust trench widths to improve process latitude.

The system may divide a trench into multiple regions and adjust each trench region separately. Specifically, the system may divide a trench's boundary into multiple segments and adjust each segment independently of other segments. For example, the system may divide trench 418's boundary into multiple segments, and adjust each segment to create trench region 428.

CONCLUSION

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now known or later developed.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art. Additionally, the above disclosure is not intended to limit the present invention. The scope of the present invention is defined by the appended claims.

What is claimed is:

1. A computer-executed method for determining mask layouts, the method comprising:
identifying a set of critical edges in a design intent, wherein the set of critical edges is desired to be printed using a trench-split based multiple patterning process which prints opposing edges of a shape using different masks if the distance between the opposing edges is less than the minimum line width that can be printed using a single stage of the trench-split based multiple patterning process;
creating a first set of mask shapes in a first mask layout for printing a first subset of critical edges in the design intent;
creating a second set of mask shapes in a second mask layout for printing a second subset of critical edges in the design intent;
in response to determining that a first mask shape in the first set of mask shapes does not abut a second mask shape in the second set of mask shapes, increasing, by computer, the first mask shape's size by a first increment; and
in response to determining that the second mask shape does not abut the first mask shape, increasing, by computer, the second mask shape's size by a second increment.

2. The method of claim 1, wherein the trench-split based multiple patterning process is a trench-split based double patterning process which transfers the first mask layout's patterns on to a hard mask, and later transfers the second mask layout's patterns on to the hard mask.

3. The method of claim 1, wherein increasing, by computer, the first mask shape's size by the first increment includes determining that increasing the first mask shape's size by the first increment does not violate a first design rule.

4. The method of claim 1, wherein increasing, by computer, the second mask shape's size by the second increment includes determining that increasing the second mask shape's size by the second increment does not violate a second design rule.

5. The method of claim 1, wherein the first and second mask shape's sizes are increased during a resolution enhancement process in an electronic design automation flow.

6. A computer-readable storage-medium storing instructions that when executed by a computer cause the computer to perform a method for determining mask layouts, the method comprising:
- identifying a set of critical edges in a design intent, wherein the set of critical edges is desired to be printed using a trench-split based multiple patterning process which prints opposing edges of a shape using different masks if the distance between the opposing edges is less than the minimum line width that can be printed using a single stage of the trench-split based multiple patterning process;
- creating a first set of mask shapes in a first mask layout for printing a first subset of critical edges in the design intent;
- creating a second set of mask shapes in a second mask layout for printing a second subset of critical edges in the design intent;
- in response to determining that a first mask shape in the first set of mask shapes does not abut a second mask shape in the second set of mask shapes, increasing the first mask shape's size by a first increment; and
- in response to determining that the second mask shape does not abut the first mask shape, increasing the second mask shape's size by a second increment.

7. The computer-readable storage-medium of claim 6, wherein the trench-split based multiple patterning process is a trench-split based double patterning process which transfers the first mask layout's patterns on to a hard mask, and later transfers the second mask layout's patterns on to the hard mask.

8. The computer-readable storage-medium of claim 6, wherein increasing the first mask shape's size by the first increment includes determining that increasing the first mask shape's size by the first increment does not violate a first design rule.

9. The computer-readable storage-medium of claim 6, wherein increasing the second mask shape's size by the second increment includes determining that increasing the second mask shape's size by the second increment does not violate a second design rule.

10. An apparatus for determining mask layouts, the apparatus comprising:
- an identifying mechanism configured to identify a set of critical edges in a design intent, wherein the set of critical edges is desired to be printed using a trench-split based multiple patterning process which prints opposing edges of a shape using different masks if the distance between the opposing edges is less than the minimum line width that can be printed using a single stage of the trench-split based multiple patterning process;
- a first creating mechanism configured to create a first set of mask shapes in a first mask layout for printing a first subset of critical edges in the design intent;
- a second creating mechanism configured to create a second set of mask shapes in a second mask layout for printing a second subset of critical edges in the design intent; and
- an increasing mechanism configured to:
  - in response to determining that a first mask shape in the first set of mask shapes does not abut a second mask shape in the second set of mask shapes, increase the first mask shape's size by a first increment, and
  - in response to determining that the second mask shape does not abut the first mask shape, increase the second mask shape's size by a second increment.

11. The apparatus of claim 10, wherein the trench-split based multiple patterning process is a trench-split based double patterning process which transfers the first mask layout's patterns on to a hard mask, and later transfers the second mask layout's patterns on to the hard mask.

12. The apparatus of claim 10, wherein the increasing mechanism is configured to determine that increasing the first mask shape's size by the first increment does not violate a first design rule.

13. The apparatus of claim 10, wherein the increasing mechanism is configured to determine that increasing the second mask shape's size by the second increment does not violate a second design rule.

* * * * *